(12) United States Patent
Hirose et al.

(10) Patent No.: US 6,217,661 B1
(45) Date of Patent: Apr. 17, 2001

(54) PLASMA PROCESSING APPARATUS AND METHOD

(75) Inventors: Naoki Hirose; Takashi Inujima; Toru Takayama, all of Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 09/196,744

(22) Filed: Nov. 20, 1998

Related U.S. Application Data

(62) Division of application No. 08/892,267, filed on Jul. 14, 1997, now Pat. No. 5,858,259, which is a division of application No. 08/158,370, filed on Nov. 29, 1993, now Pat. No. 5,685,913, which is a continuation of application No. 07/770,433, filed on Sep. 26, 1991, now abandoned, which is a division of application No. 07/461,938, filed on Jan. 8, 1990, now abandoned, which is a division of application No. 07/186,219, filed on Apr. 26, 1988, now Pat. No. 4,926,791.

(30) Foreign Application Priority Data

Apr. 27, 1987 (JP) ................................................ 62-104024
Apr. 27, 1987 (JP) ................................................ 62-104025

(51) Int. Cl.$^7$ .................................................. C23C 16/00
(52) U.S. Cl. ........................................... 118/723; 156/345
(58) Field of Search ........................... 118/723 IR, 723 I, 118/723 ER, 723 MW, 723 ME; 156/345

(56) References Cited

U.S. PATENT DOCUMENTS

| | | |
|---|---|---|
| 3,661,637 | 5/1972 | Sirtl . |
| 3,911,318 | 10/1975 | Spero et al. . |
| 4,047,496 | 9/1977 | McNeilly et al. . |
| 4,125,431 | 11/1978 | Fowler ................................. 376/140 |
| 4,354,999 | 10/1982 | Priest ................................... 376/142 |
| 4,394,400 | 7/1983 | Green et al. . |
| 4,401,054 | 8/1983 | Matsuo et al. . |
| 4,430,138 | 2/1984 | Suzuki .......................... 118/723 MK |
| 4,434,188 | 2/1984 | Kamo et al. ............................ 427/34 |
| 4,438,368 | 3/1984 | Abe et al. . |
| 4,481,229 | 11/1984 | Suzuki et al. . |

(List continued on next page.)

FOREIGN PATENT DOCUMENTS

| | | |
|---|---|---|
| 0046945 | 10/1982 | (EP) . |
| 0209469 | 1/1987 | (EP) . |
| 209109 | 1/1987 | (EP) ............................ 118/723 MR |
| 5963732 | 4/1984 | (JP) . |

(List continued on next page.)

OTHER PUBLICATIONS

Hiroshi Kawarada et al.; "Large Area Chemical Vapour Deposition of Diamond Particles and Films Using Magneto–Microwave Plasma"; Japanese Journal of Applied Physics, vol. 26, No. 6, Jun. 1987, pp. L1032–L1034.

Bachmann et al., "Emerging Technology of Diamond Thin Films" (pp. 24,32) May 15, 1989 C&EN.

Y. Arnal et al. "Plasma Etching in Magnetic Multipole Discharge" Appl. Phys. Lett 45(2) Jul. 15, 1984, p. 132–134.

"ECR Type Ion Source", Proc. 10th Symp. on ISIAT '86. (Tokyo, 1986), pp. 117–120 by M. Tamba, Y. Ishibe and Y. Sakamoto.

(List continued on next page.)

Primary Examiner—Blaine Copenheaver
Assistant Examiner—Norca L. Torres
(74) Attorney, Agent, or Firm—Eric J. Robinson; Nixon Peabody LLP

(57) ABSTRACT

A plasma processing apparatus and method is equipped with a vacuum chamber, helmholtz coils, a microwave generator and gas feeding systems. An auxiliary magnet is further provided in order to strengthen the magnetic field in the vacuum chamber to produce centrifugal drifting force which confine the plasma gas about the center position of the vacuum chamber.

22 Claims, 6 Drawing Sheets

U.S. PATENT DOCUMENTS

| | | |
|---|---|---|
| 4,503,807 | 3/1985 | Nakayama et al. . |
| 4,513,684 | 4/1985 | Nath et al. . |
| 4,532,199 | 7/1985 | Ueno et al. . |
| 4,559,100 | 12/1985 | Ninomiya et al. ............... 216/70 X |
| 4,563,240 | 1/1986 | Shibata et al. . |
| 4,609,428 | 9/1986 | Fujimura ......................... 216/70 X |
| 4,636,401 | 1/1987 | Yamazaki et al. . |
| 4,640,224 | 2/1987 | Bunch et al. . |
| 4,657,776 | 4/1987 | Dietrich et al. . |
| 4,663,183 | 5/1987 | Ovshinsky et al. . |
| 4,683,838 * | 8/1987 | Kimura et al. ...................... 118/715 |
| 4,727,293 | 2/1988 | Asmussen ...................... 315/111.41 |
| 4,728,529 | 3/1988 | Etzkorn et al. . |
| 4,776,918 | 10/1988 | Otsubo et al. . |
| 4,778,561 | 10/1988 | Ghanbari ............................. 427/38 |
| 4,869,923 | 9/1989 | Yamazaki . |
| 4,876,983 | 10/1989 | Fukuda et al. . |
| 4,926,791 | 5/1990 | Hirose et al. ...................... 427/45.1 |
| 4,940,015 | 7/1990 | Kobashi et al. . |
| 4,960,073 | 10/1990 | Suzuki et al. ................... 315/118.41 |
| 4,973,494 | 11/1990 | Yamazaki . |
| 4,973,883 | 11/1990 | Hirose et al. ....................... 118/723 |
| 5,013,579 | 5/1991 | Yamazaki . |
| 5,015,494 | 5/1991 | Yamazaki . |
| 5,039,548 | 8/1991 | Hirose et al. ................. 118/723 MA |
| 5,162,296 | 11/1992 | Yamazaki . |
| 5,266,363 | 11/1993 | Yamazaki . |

FOREIGN PATENT DOCUMENTS

| | | |
|---|---|---|
| 59-136130 | 8/1984 | (JP) . |
| 61-213377 | 9/1984 | (JP) . |
| 103098 | 6/1985 | (JP) . |
| 60-115235 | 6/1985 | (JP) . |
| 61-36200 | 2/1986 | (JP) . |
| 61-47628 | 3/1986 | (JP) . |
| 61-150219 | 7/1986 | (JP) . |
| 61-158898 | 7/1986 | (JP) . |
| 61-213377 | 9/1986 | (JP) . |
| 61-267324 | 11/1986 | (JP) . |
| 62-7859 | 1/1987 | (JP) . |
| 62-30891 | 2/1987 | (JP) . |
| 62-83471 | 4/1987 | (JP) . |
| 62-115821 | 5/1987 | (JP) ............................ 118/723 MR |
| 62-96397 | 5/1987 | (JP) . |
| 63-43324 | 2/1988 | (JP) . |
| 63-80523 | 4/1988 | (JP) . |
| 63-217620 | 9/1988 | (JP) . |
| 63-225528 | 9/1988 | (JP) . |
| 1-59729 | 3/1989 | (JP) . |
| 1-73776 | 3/1989 | (JP) . |

OTHER PUBLICATIONS

"An Optimum Condition of Multipole Field for an ECR–Type Ion Source", Jap. Journal of Appl. Phys., vol. 25, No. 9, Sep., 1986 by Ishii et al., p. L712–L715.

"Suppression of Noise in a Discharge Tube by a Minimum–B Type Magnet", Jap. Journal of Appl. Phys., vol. 27, No. 2, Feb. 1988, by Hiroshi Amemiya, pp. 297–301.

* cited by examiner

PLASMA PROCESSING APPARATUS AND METHOD

This application is a divisional of Ser. No. 08/892,267, filed Jul. 14, 1997; now U.S. Pat. No. 5,858,259 which itself is a divisional of Ser. No. 08/158,370, filed Nov. 29, 1993, now U.S. Pat. No. 5,685,913; which is a continuation of Ser. No. 07/770,433, filed Sep. 26, 1991, abandoned; which is a divisional of Ser. No. 07/461,938, filed Jan. 8, 1990, abandoned; which is a divisional of Ser. No. 07/186,219, filed Apr. 26, 1988, now U.S. Pat. No. 4,926,791.

BACKGROUND OF THE INVENTION

This invention relates to a plasma processing apparatus and method.

There have been known the ECR CVD for depositing thin films on a substrate. In this deposition method, a substrate may be placed in a vacuum chamber apart from the resonating space and a thin film such as an amorphous film is formed on the substrate by virtue of a divergent magnetic field induced in the vacuum chamber.

The ECR CVD can be performed in combination with other known deposition methods such as heated filament CVD, chemical transportation method, plasma CVD making use of a high frequency power at 13.56 MHz, microwave-assisted CVD. In accordance with this method, a reactive gas is confined and excited by supplying a microwave under a magnetic field in accordance with the electron cycrotron resonance. The excited reactive gas is drifted to a substrate which is located at a position remote from the resonating space. At the remote position, the excited gas is deposited on the substrate or attacks to the substrate to effected anisotropic etching. The pressure in the chamber during process has been maintained at a relatively low pressure, e.g. of the order of $10^{-4}$ Torr. Because of this, it is very difficult to form a highly crystallized film such as a diamond film and to choose the process condition with a broad flexibility

SUMMARY OF THE INVENTION

It is therefore an object of the invention to provide a plasma processing apparatus and method in which a highly energized plasma gas is confined about the center position at which a substrate to be processed is disposed.

It is therefore an object of the invention to provide a plasma processing apparatus and method in which highly crystallized films can be deposited under flexible condition.

According to one aspect of the invention, an auxiliary magnet is provided in addition to a main magnet which produces a magnetic field parallel with the microwave propagating direction allowing the plasma gas to resonating with the microwave. The auxiliary magnet is located along the wall of the reaction chamber for the purpose of enhancing the strength of magnetic field at the periphery of the reaction chamber. Since charged particles are subjected to a drifting force proportional to the minus of the gradient of the absolute strength of the magnetic field, plasma gas is confined in the center by virtue of the additional magnetic field induced by the auxiliary magnet.

The resonance taking place in the reaction chamber includes the electron cycrotron resonance, the whistler mode resonace, or other type resonance which is caused by supplying a microwave under a magnetic field such as the mixed cyclotron resonance. By virtue of such a resonance, a highly energized plasma gas having its high density is obtained. In case of carbon deposition, a highly energized plasma produces a large amount of excited carbon atoms and the high reproducibility is achieved.

In accordance with the most broad concept, it is noted that the present invention is also effective in case of thermal CVD, photo-assisted CVD or so forth in which no magnetic field is utilized. The reactive gas is confined in the vicinity where deposition is desired in the other deposition systems.

BRIEF DESCRIPTION OF THE INVENTION

FIG. 1 is a schematic diagram showing a plasma processing apparatus for in accordance with the present invention.

FIGS. 2(A) and 2(B) are a cross sectional view and a side elevation view showing Ioffe bars for use in accordance with the present invention.

Figure 6A:
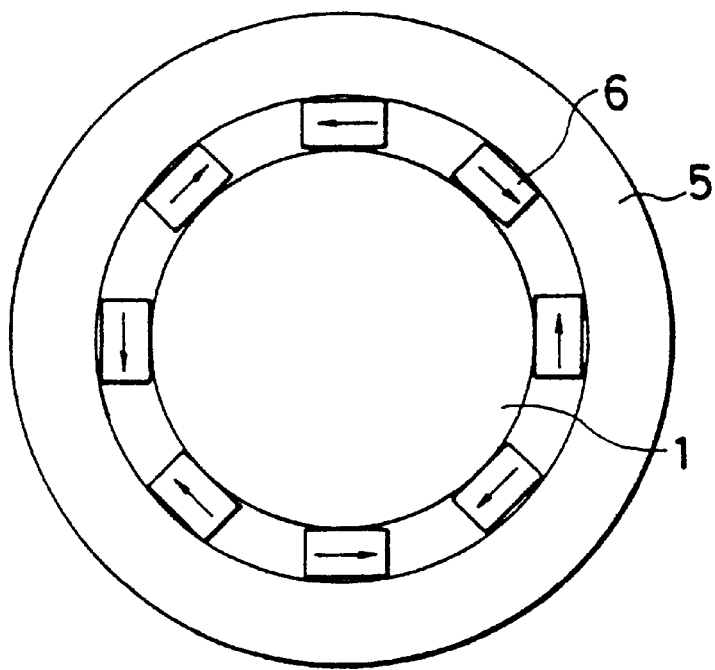
Figure 6B:
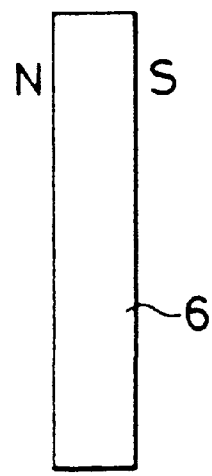

FIGS. 6(A) and 6(B) are a cross sectional view and a side elevation view showing Ioffe bars another type for use in accordance with the present invention.

Figure 7:
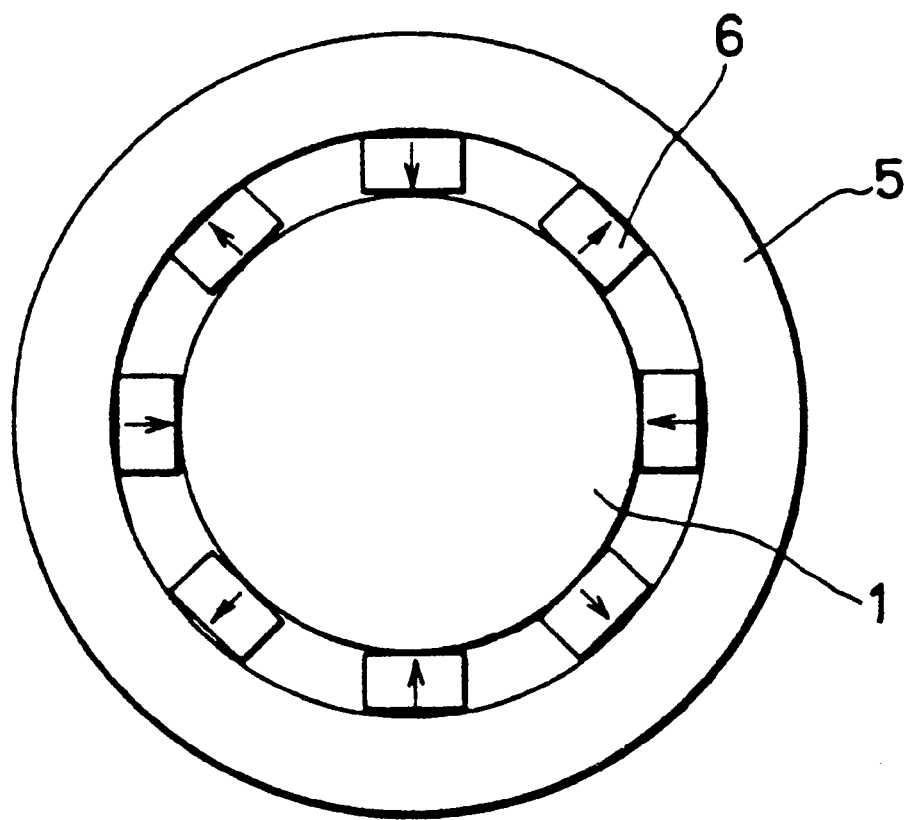

FIG. 7 is a cross sectional view Ioffe bars a further type for use in accordance with the present invention.

DETAILED DESCRIPTION OF THE PREFERRED EMBODIMENTS

Figure 1:
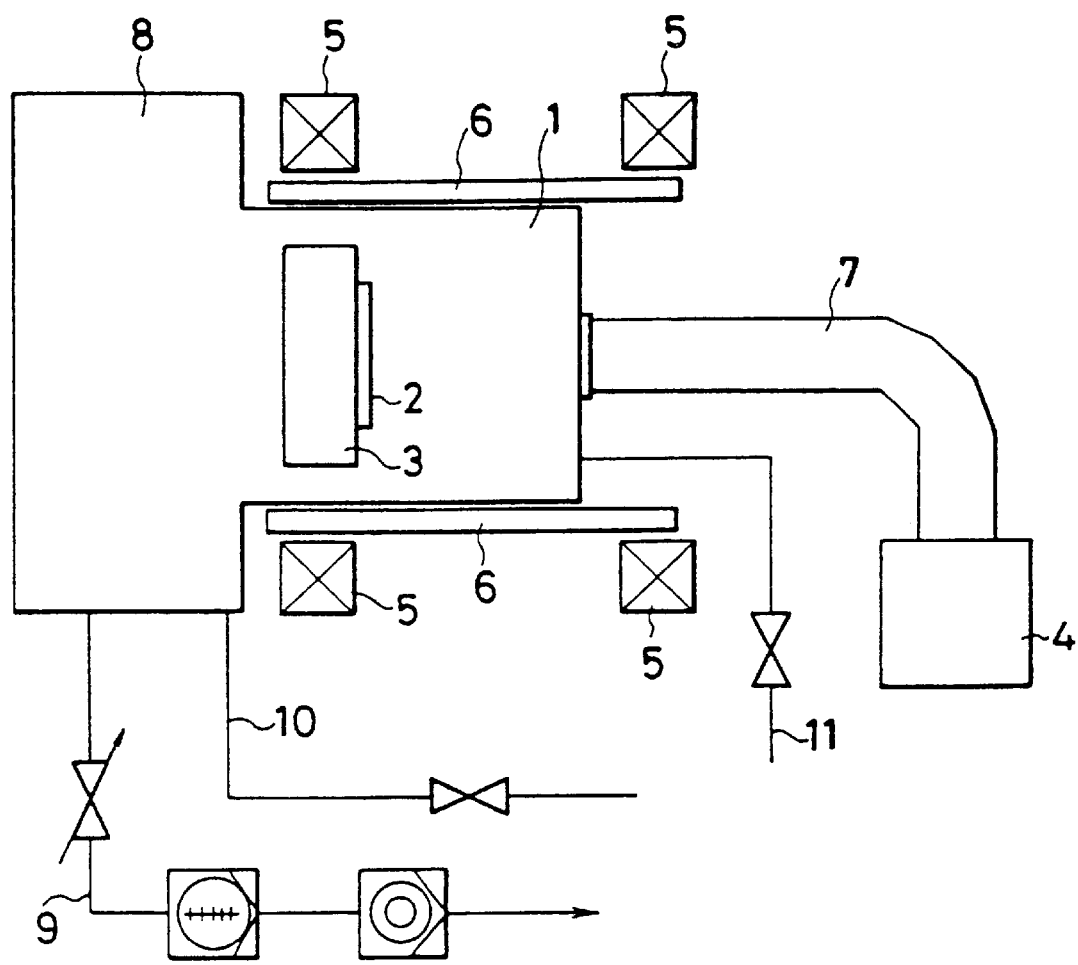

Referring to FIG. 1, a microwave assisted plasma-CVD apparatus in accordance with the present invention is illustrated. In the figure, the apparatus comprises a reaction vacuum chamber 1 defining a resonating space therein, a loading chamber 8 connected with the vacuum chamber 1, a substrate holder 3 capable of carrying a substrate 2 to be treated, helmholts coils 5 around the reaction chamber 1, an auxiliary electro-magneto 6 located inside of the helmholtz coils around the reaction chamber, a microwave generator 4 connected to the reaction chamber 1 through a waveguide 7, an evacuating system 9, and gas feeding systems 10 and 11. The holder 3 is made of a highly thermal conductive material, such as aluminium nitride, which less disturb the microwave transmission from a microwave introduction window 12.

Figure 2A:
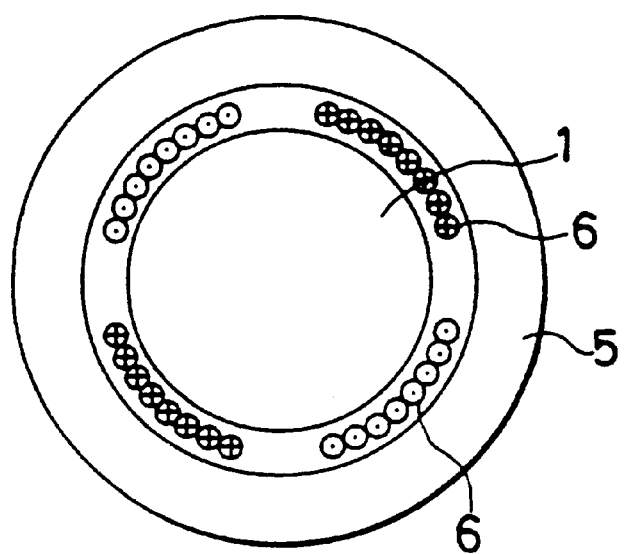
Figure 2B:
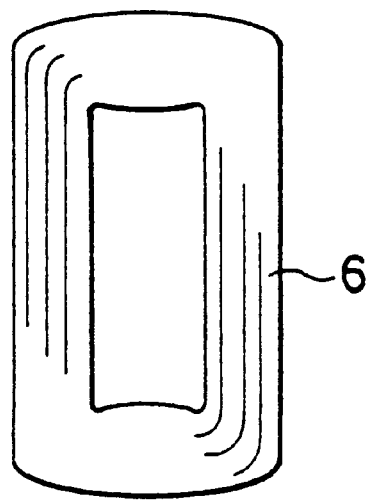
Figure 3:
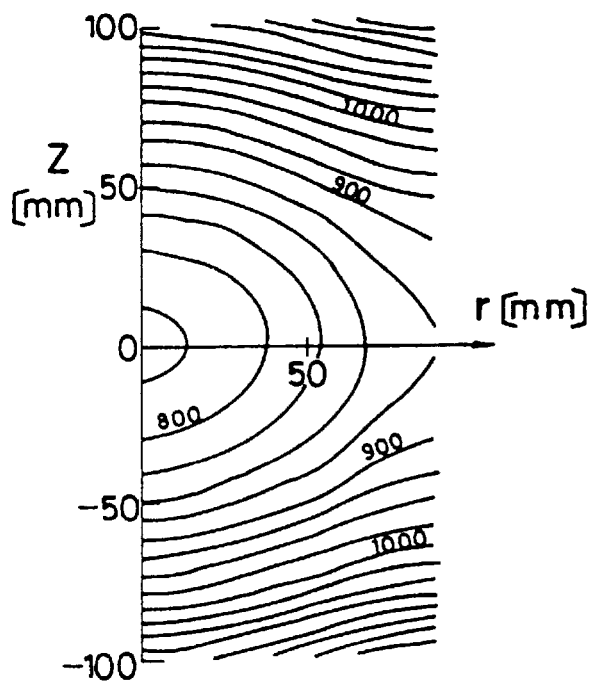
FIG. 3 is a graphical diagram showing the strength of magnetic field in a reaction chamber in accordance with the present invention.
Figure 4:
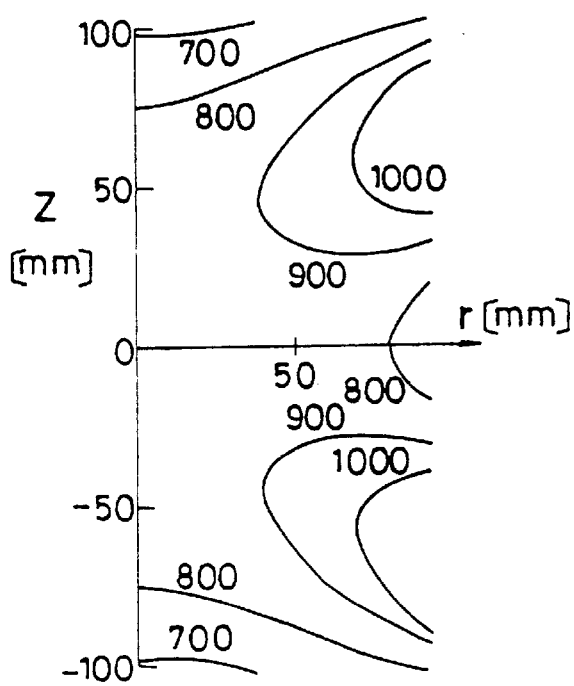
FIG. 4 is a graphical diagram showing the strength of magnetic field induced only by helmholtz coils in a reaction chamber.

The auxiliary magnet 6 consists of two electro-magnets providing Ioffe bars which extend in the direction of the microwave propagation (FIGS. 2(A) and 2(B)). In FIG. 2(A), the end marks of arrow denote the current passing direction of each bar. The object of the provision of the Ioffe bars is to strengthen the strength of magnetic field near the cylindrical wall of the reaction chamber 1. FIG. 3 is a graphical diagram showing the surfaces on each of which the strength of the magnetic field is constant. The abscissa is the distance (r) from the axis of the cylindrical reaction chamber and the ordinate is the axial distance from the center plane of the helmholtz coils 5. The figure given to each surface denotes the strength (Gauss) of the magnetic field on that surface. As shown in the diagram, the strength of the magnetic field takes a larger value at a nearer position to the cylindrical wall, so that the drifted force excerted on the plasma is always centrifugal. The magnetic field is weakest on the axis of the cylindrical reaction chamber. FIG. 4 is a graphical diagram showing the surfaces on which the magnetic field is constant when the auxiliary magnet is not used.

Next, the deposition process with this apparatus will be described. A substrate 1 is mounted on the holder 3 and disposed at an appropriate position in the reaction chamber 1 where the microwave and the magnetic field satisfy the ECR condition. After evacuating the reaction chamber 1, the substrate 1 is heated to 500° C. and hydrogen gas is leaked into the chamber 1 at 10 SCCM through the gas feeding system 11. The introduced hydrogen gas is energized into a plasma gas by virtue of a 2.45 microwave emitted from the generator 4 and a magnetic field induced by both the helmholtz coils 5 and the auxiliary magnet 6. The strength of the portion of the magnetic field that is induced by the coils 5 is about 2 K Gauss at the resonating space (a partlon of the reaction chamber). The pressure in the resonating space is maintained at 0.1 Pascal. The surface of the substrate is cleaned by virtue of the plasma.

Then, the introduction of hydrogen is halted and a carbon compound gas such as $C_2H_2$ or $CH_4$ is introduced into the reaction chamber 1 and excited in the same way as hydrogen as explained above. By this process, a diamond or i-carbon film is deposited on the substrate which has been heated to about 500° C. According to experiment, diamond films were deposited particularly when the substrate temperatures were not higher than 650° C.

In accordance with the electron beam defraction analysis, a halo pattern was observed at a relative low temperature together with a spot pattern which is peculier to amorphous structures. Such an image indicates the presence of i-carbon. The halo pattern gradually distincted as the substrate temperature was elevated. When the substrate temperature was elevated higher than 650° C., the deposited film became composed mainly of diamond. The diamond film was confirmed by obtaining its Raman spectrum. The spectrum includes a moderate peak near 1500 $cm^{-1}$ and a sharp peak near 1333 $cm^{-1}$.

For reference, the same process was repeated without inducing a magnetic field in the reaction chamber. The film thus deposited was made of graphite. Even with the presence of magnetic field, no 1-carbon film could not be deposited on a substrate at a temperature lower than 150° C.

The above process can be applied to a method of depositing polycrystalline silicon carbide films by making use of silicon carbide gaseous compounds as the reactive gas, to a method of depositing aluminium nitride films by making use of a reactive gas consisting of an aluminium compound gas and ammonia, and a method of depositing films having a high melting point, e.g. films made of tungsten, titanium and molybdenum or their silicon compounds. In the same way, the present invention can be applied for the deposition of BN, CN, TiN and BP.

Figure 5:
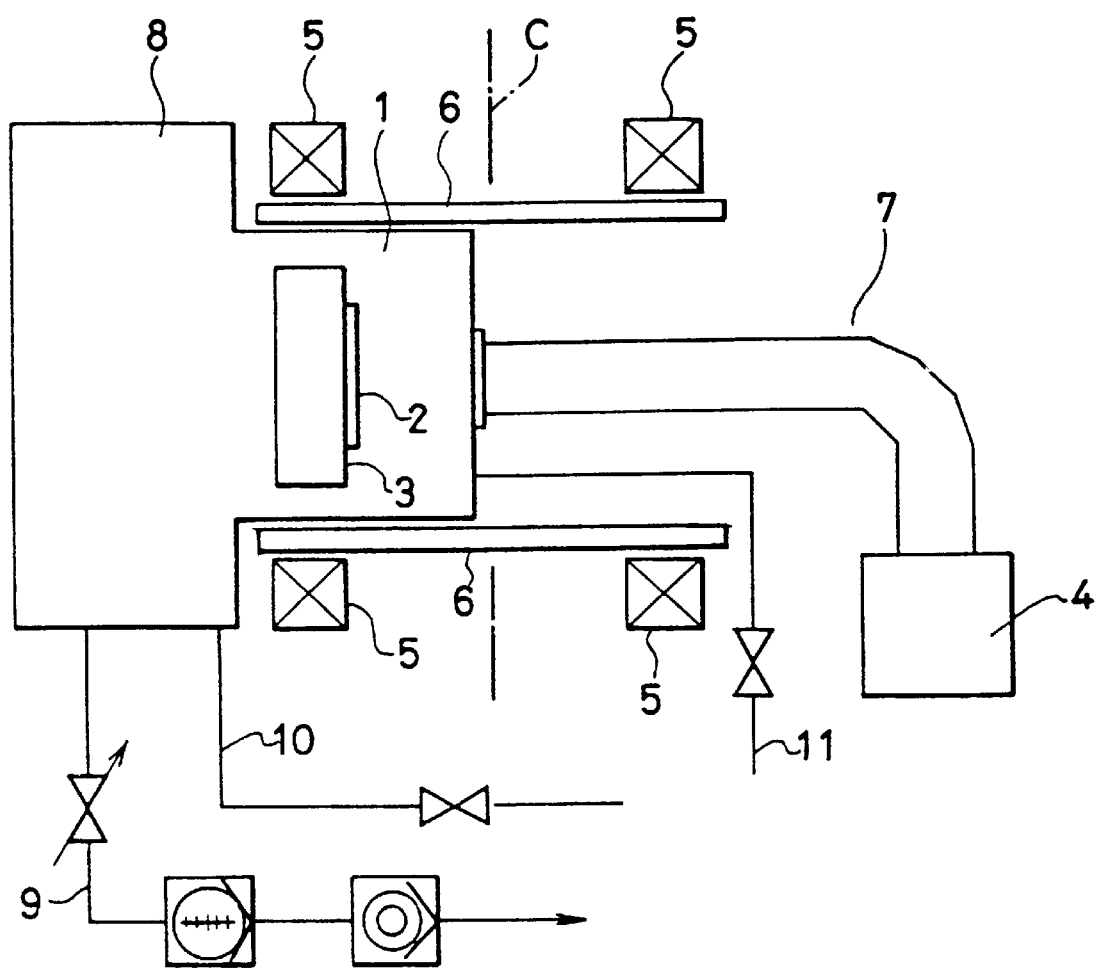
FIG. 5 is a schematic diagram showing another plasma processing apparatus for in accordance with the present invention.

FIG. 5 a schematic view showing another type of plasma processing apparatus. This apparatus is largely same as the above explained apparatus besides the relationship between the the helmholtz coils 5 and the connection position of the waveguide 7 to the reacion chamber 1. In the arrangement, it is very important that a microwave is mixed with a reactive gas only in the left side of the center surface C between the helmholtz coils 5, so that the reactive gas is subjected to the magnetic field that is monotonically decreases toward the left in the resonating space. The magnetic field functions to drift the plamsa gas to the substrate 2 and prevent the gas from producing deposition on the right side wall.

The Ioffe magnet may be another type magnet. FIGS. 6(A) and 6(B) are drafted in correspondence with FIGS. 2(A) and 2(B) to show another type of Ioffe magnet suitable for use in accordance with the invention. As shown in the figure, a plurality of rod-shaped permanent magnets are arranged immediately inside of the helmholtz coils 5 with their magnetic moments directed to the circumferential direction as indicated by arrows. The magnetic moments can be arraged in the axial direction as shown in FIG. 7.

While a description has been made for several embodiments, the present invention should be limited only by the appended claims and should not be limited by the particular examples. What follow are some examples of modifications and variation according to the invention. By adding oxygen, water or the like to the reactive gas, the crystallinity of the deposited film can be enhanced. By irradiating the exciting plasma gas with ultraviolet rays between the resonating space and the substrate to be coated, the exciting plasma gas can hold its energy even substantially distant from the resonating space. For instance, a diamond or i-carbon film can be deposited on a large area. Also, by applying a DC bias voltage to the exciting plasma, a larger amount plasma reaches the substrate enabling a high deposition speed. Also, as easily understood by those skilled in the art, the present invention is effective when used for plasma etching, particularly by making use of ECR. The etchant gas is confined by virtue of the magnetic field in the same way as explained above.

What is claimed is:

1. A plasma CVD apparatus for forming a film comprising:

a vacuum chamber having a central axis;

a gas introducing means for introducing a reactive gas into said vacuum chamber;

means for introducing a microwave into said vacuum chamber in a direction parallel to said central axis thereof;

a substrate holder for holding a substrate in said vacuum chamber;

means for establishing a first magnetic field in said vacuum chamber in order to excite said reactive gas into a plasma by an interaction between said first magnetic field and said microwave where said substrate is located substantially at an electron cyclotron resonance point in said vacuum chamber where said microwave and first magnetic field satisfy the condition for electron cyclotron resonance; and means for establishing a second magnetic field in said vacuum chamber, said second magnetic field is such that said plasma is forced to move away from inner walls of said vacuum chamber by said second magnetic field.

2. The apparatus of claim 1, wherein said first magnetic field is substantially in parallel with the central axis of said vacuum chamber.

3. The apparatus of claim 1, wherein said second magnetic field is substantially perpendicular to the central axis of said vacuum chamber.

4. The apparatus of claim 1 wherein said film comprises carbon.

5. A plasma CVD apparatus comprising:

a chamber having a central axis;

a coil provided around the periphery of said chamber to induce a first magnetic field;

an even-numbered plurality of auxiliary magnets numbering at least two and provided around the periphery of said chamber;

a microwave introducing means provided along the central axis of said chamber;

a substrate holder for holding a substrate in said chamber, wherein said auxiliary magnets are arranged symmetrically with respect to the central axis of said chamber in such a way that the magnetic poles of every auxiliary magnet are respectively reversed in polarity relative to the adjoining magnetic poles of an auxiliary magnet adjacent thereto, wherein an electron cyclotron resonance induced by an electric field formed by microwaves introduced into said chamber through said microwave introducing means and a magnetic field formed by said coil and said auxiliary magnets is utilized to turn a plasma-forming gas introduced into said chamber into a plasma to form a film on the substrate.

6. The apparatus according to claim 5 wherein said auxiliary magnets are each constituted of a permanent magnet.

7. The apparatus according to claim 5 wherein said film comprises carbon.

8. A plasma CVD apparatus for forming a film comprising:
   a reaction chamber having a central axis;
   a gas introducing means for introducing a reactive gas into said vacuum chamber;
   means for introducing a microwave into said vacuum chamber in a direction parallel to said central axis thereof;
   a substrate holder for holding a substrate in said vacuum chamber;
   means for establishing a first magnetic field in said vacuum chamber in order to excite said gas into a plasma by an interaction between said first magnetic field and said microwave; and
   means for establishing a second magnetic field in said vacuum chamber, wherein said second magnetic field is such that said plasma is forced to move away from inner walls of said vacuum chamber by said second magnetic field.

9. The apparatus of claim 8, wherein said first magnetic field is substantially in parallel with the central axis of said vacuum chamber.

10. The apparatus of claim 8, wherein said second magnetic field is substantially perpendicular to the central axis of said vacuum chamber.

11. The apparatus of claim 8 wherein said film comprises carbon.

12. A plasma CVD apparatus for forming a carbon film comprising:
   a vacuum chamber having a central axis;
   a gas introducing means for introducing a carbon compound gas into said vacuum chamber;
   means for introducing a microwave into said vacuum chamber in a direction parallel to said central axis thereof;
   a substrate holder for holding a substrate in said vacuum chamber;
   means for establishing a first magnetic field in said vacuum chamber in order to excite said carbon compound gas into a plasma by an interaction between said first magnetic field and said microwave where said substrate is distant from an electron cyclotron resonance point in said vacuum chamber; and
   means for establishing a second magnetic field in said vacuum chamber, said second magnetic field is such that said plasma is forced to move away from inner walls of said vacuum chamber by said second magnetic field.

13. The apparatus of claim 12, wherein said first magnetic field is substantially in parallel with the central axis of said vacuum chamber.

14. The apparatus of claim 12, wherein said second magnetic field is substantially perpendicular to the central axis of said vacuum chamber.

15. The apparatus of claim 12, wherein said carbon film exhibits a halo pattern in an electron beam diffraction analysis.

16. A plasma CVD apparatus for forming a carbon film comprising:
   a chamber having a central axis;
   a gas introducing means for introducing a carbon compound gas into said vacuum chamber;
   a coil provided around the periphery of said chamber to induce a first magnetic field;
   an even-numbered plurality of auxiliary magnets numbering at least two and provided around the periphery of said chamber;
   a microwave introducing means provided along the central axis of said chamber;
   a substrate holder for holding a substrate in said chamber,
   wherein said auxiliary magnets are arranged symmetrically with respect to the central axis of said chamber in such a way that the magnetic poles of every auxiliary magnet are respectively reversed in polarity relative to the adjoining magnetic poles of an auxiliary magnet adjacent thereto,
   wherein an electron cyclotron resonance induced by an electric field formed by microwaves introduced into said chamber through said microwave introducing means and a magnetic field formed by said coil and said auxiliary magnets is utilized to turn a plasma-forming gas introduced into said chamber into a plasma to form a film on the substrate.

17. The apparatus according to claim 16, wherein said auxiliary magnets are each constituted of a permanent magnet.

18. The apparatus according to claim 16, wherein said carbon film exhibits a halo pattern in an electron beam diffraction analysis.

19. A plasma CVD apparatus for forming a carbon film comprising:
   a reaction chamber having a central axis;
   a gas introducing means for introducing a carbon compound gas into said vacuum chamber;
   means for introducing a microwave into said vacuum chamber in a direction parallel to said central axis thereof;
   a substrate holder for holding a substrate in said vacuum chamber;
   means for establishing a first magnetic field in said vacuum chamber in order to excite said carbon compound gas into plasma by an interaction between said first magnetic field and said microwave; and
   means for establishing a second magnetic field in said vacuum chamber, wherein said second magnetic field is such that said plasma is forced to move away from inner walls of said vacuum chamber by said second magnetic field.

20. The apparatus of claim 19, wherein said first magnetic field is substantially in parallel with the central axis of said vacuum chamber.

21. The apparatus of claim 19, wherein said second electric field is substantially perpendicular to the central axis of said vacuum chamber.

22. The apparatus of claim 19, wherein said film exhibits a halo pattern in an electron beam diffraction analysis.

* * * * *